United States Patent
Guo et al.

(10) Patent No.: US 7,271,473 B1
(45) Date of Patent: Sep. 18, 2007

(54) SEMICONDUCTOR POWER TRANSMISSION DEVICE

(75) Inventors: Sam Yonghong Guo, Canton, MI (US); Myron Udell Trenne, Farmington Hills, MI (US)

(73) Assignee: Yazaki North America, Inc., Canton, MI (US)

( * ) Notice: Subject to any disclaimer, the term of this patent is extended or adjusted under 35 U.S.C. 154(b) by 471 days.

(21) Appl. No.: 11/053,021

(22) Filed: Feb. 8, 2005

(51) Int. Cl.
*H01L 23/02* (2006.01)
*H01L 23/34* (2006.01)

(52) U.S. Cl. ............... 257/678; 257/718; 257/719; 257/726; 257/727; 257/E23.086

(58) Field of Classification Search ........ 257/678–733, 257/787–796, E23.001–E23.194
See application file for complete search history.

(56) References Cited

U.S. PATENT DOCUMENTS

| | | | |
|---|---|---|---|
| 4,261,005 A | * | 4/1981 | McCarthy .................. 257/718 |
| 4,575,038 A | | 3/1986 | Moore |
| 4,710,852 A | | 12/1987 | Keen |
| 4,872,089 A | | 10/1989 | Ocken et al. |
| 5,130,888 A | | 7/1992 | Moore |
| 5,592,021 A | * | 1/1997 | Meschter et al. ........... 257/727 |
| 5,747,877 A | | 5/1998 | Wilson |
| 6,476,481 B2 | | 11/2002 | Woodworth et al. |
| 6,600,652 B2 | * | 7/2003 | Chandran et al. .......... 361/704 |

* cited by examiner

*Primary Examiner*—Jasmine Clark
(74) *Attorney, Agent, or Firm*—Young Basile

(57) ABSTRACT

A semiconductor power circuit in which multiple field effect transistor dies are solder connected between opposed contact surfaces of overlying flat conductors and are clamped by means of spring clips which are arranged in symmetrically opposed relationship. A circuit board also disposed between the clamped surfaces is protected from the clamping forces by means of a soft paper layer with holes registering with similar holes in the circuit board to permit solder pads to pass there through.

8 Claims, 3 Drawing Sheets

SEMICONDUCTOR POWER TRANSMISSION DEVICE

FIELD OF THE INVENTION

This invention relates to power semiconductor devices and more particularly to a power control device using semiconductor power devices such as field effect transistors in die form and in a novel arrangement which eliminates the need for wire bonding.

BACKGROUND

Referring to FIG. 1, which is labeled "Prior Art", known semiconductor power circuits comprising multiple semiconductor dies 10 are connected electrically in parallel between flat conductors 12 and 14 by means of bonded wires 16. The bottom surfaces of the semiconductor dies 10 are soldered to the top contact surface of the inner conductor 12. Wires 16 are used to connect the opposite electrodes of the semiconductor devices 10 to the surrounding legs 18 and 20 of the second conductor 14, the legs 18 and 20 being positioned around the outside ledges of the conductor 12 in order to be in proximity to the devices 10 thereby to shorten the length of the wires 16. A printed circuit board 22 carrying components and connectors for control purposes is disposed between the semiconductor dies 10.

The prior art arrangement shown in FIG. 1 has a number of disadvantages. The primary disadvantages arise out of the wires 16 as well as the bonding process and include substantially increased electrical resistance in the overall circuit as well as the costs and manufacturing difficulties inherently associated with the wire bonding operation. The increased resistance leads to higher levels of wasted power and lower electrical efficiencies as well as shortened life of the components. In addition, the geometry of the package including the surrounding legs 18 and 20 of the second conductor 14 creates a package of substantial width.

SUMMARY

In accordance with the present invention, a semiconductor power device of increased efficiency and reduced width is provided in such a way as to eliminate the need for wire bonding operation and the disadvantages associated therewith. In general this is accomplished by means of a stacking arrangement in which top and bottom conductors having opposing contact surfaces are arranged in overlying space relationship with the three electrode semiconductor devices sandwiched therebetween and electrically connected to the contact surfaces by means of solder bonds or the equivalent. A circuit board having control components may also be disposed between the conductors, the preferred arrangement being such that the solder bonds between the drain and source electrodes of the semiconductor dies and the contact surfaces of the top and bottom conductors extending through the printed circuit boards. Further in accordance with the present invention, mechanical clamping devices are provided to produce a compressive force on the stacked arrangement which reduces the effects of thermocycling, thereby to minimize resistance losses over time.

In the preferred form, the stacked arrangement further comprises a soft compressable insulator layer between the circuit board and one of the contact surfaces thereby to mechanically isolate the printed circuit board and ensure that it does not experience the compressive forces produced by the clamp. The clamp itself may take the form of two simple spring clips disposed in opposed symmetrical relationship on opposite sides of the stacked package.

Other applications of the present invention will become apparent to those skilled in the art when the following description of the best mode contemplated for practicing the invention is read in conjunction with the accompanying drawings.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
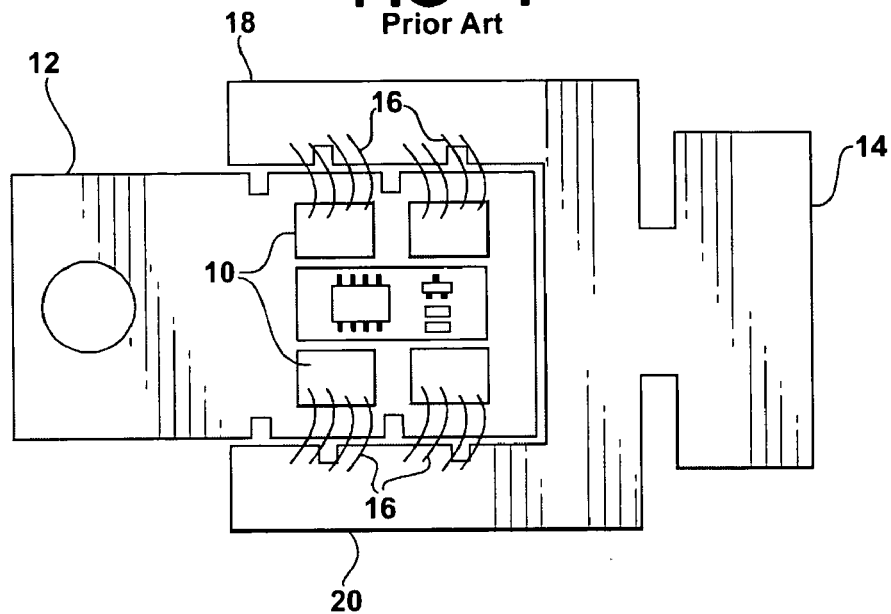
FIG. 1 illustrates the prior art.

Referring now to FIGS. 2-5, the illustrative embodiment of the invention comprises a top strip-like copper conductor 24 and a bottom strip-like copper conductor 26 disposed in spaced, parallel and partially overlying relationship. The conductors 24 and 26 have facing contact surfaces which are essentially flat and parallel and spaced apart a sufficient distance to accommodate components hereinafter described. Four semiconductor dies 28 in the form of field effect transistors are disposed between the contact surfaces of the conductors 24 and 26 and are electrically connected to them by means of solder pads 50 and 52 best shown in FIG. 5. As is well known to those skilled in the art, the semi conductor dies 28 comprise opposed source and drain electrodes, and a gate electrode which in the illustrated embodiment is located at an edge of the uppermost surfaces shown in FIG. 3. The gate electrode is connected by way of traces indicated by dotted lines in FIG. 3 to circuit components 34 carried on a printed circuit board 30 having connectors 36 for electrical connection to external control circuits whereby the power circuit consisting of the series combination of conductor 26, dies 28 and conductor 24 may be subject to electrical control for various purposes such as motor speed control, and a variety of other control functions associated with a variety of different devices to which the circuit of the present invention may be applied.

Figure 5:
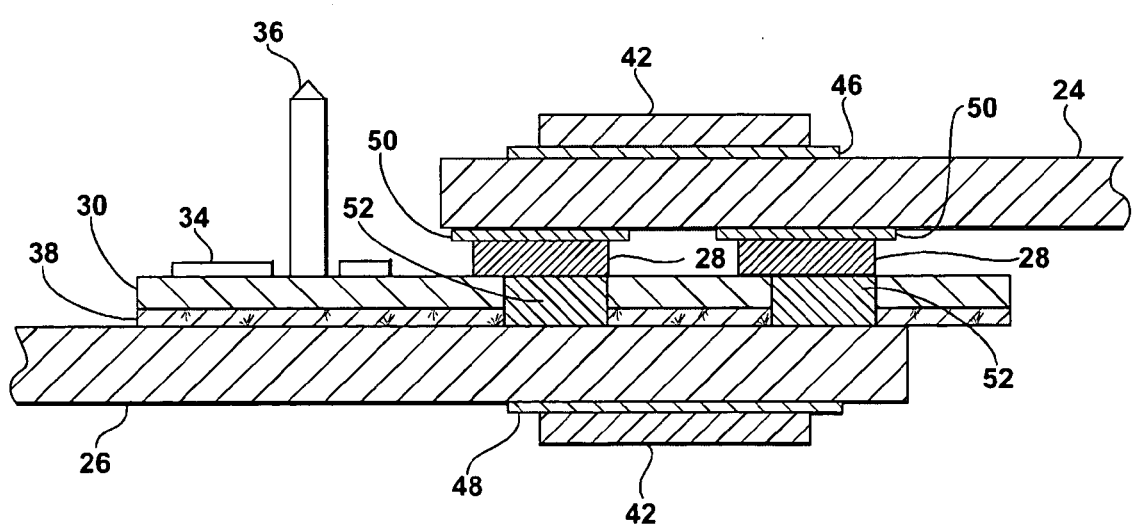
FIG. 5 is a side sectional view of the device of FIG. 2.

In accordance with the invention, the printed circuit board 30 is provided with holes 32 which are aligned with but are slightly smaller than the projected areas of the dies 28 such that the dies 28 may sit atop the holes 32 and the printed circuit board 30 as best shown in FIG. 5. This exposes the bottom electrode of each of the dies 28 to the solder connections 52 which run through the printed circuit board to the contact surface of the bottom conductor 26. Solder connections 50 connect the top surfaces of the dies 28 directly to the underside; i.e., the contact surface, of the upper conductor 24.

Figure 2:
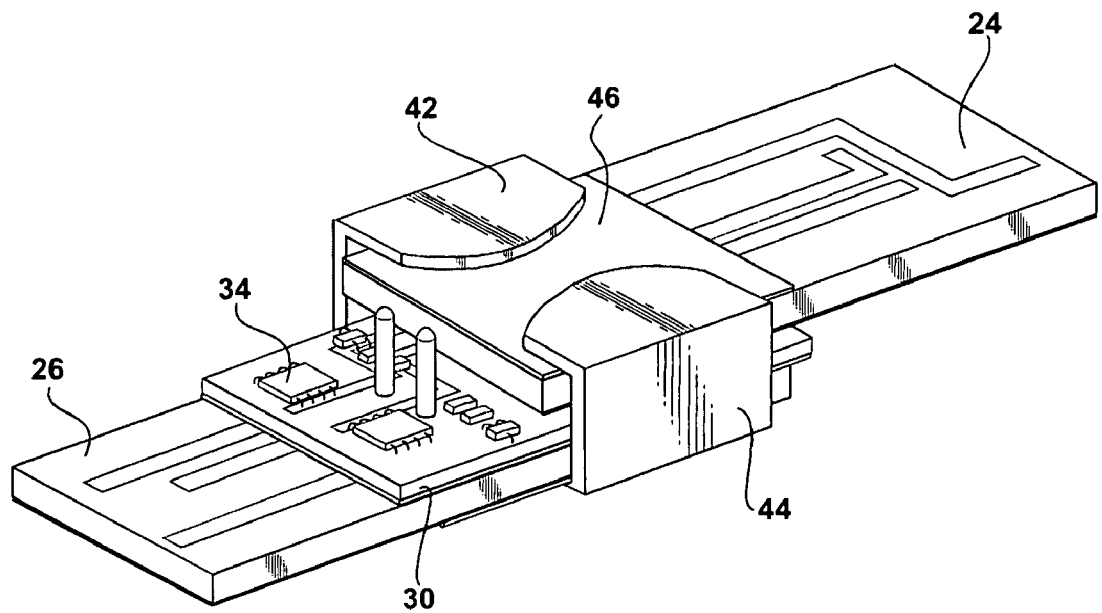
FIG. 2 is a perspective view of a stacked semiconductor device embodying the invention.
Figure 3:
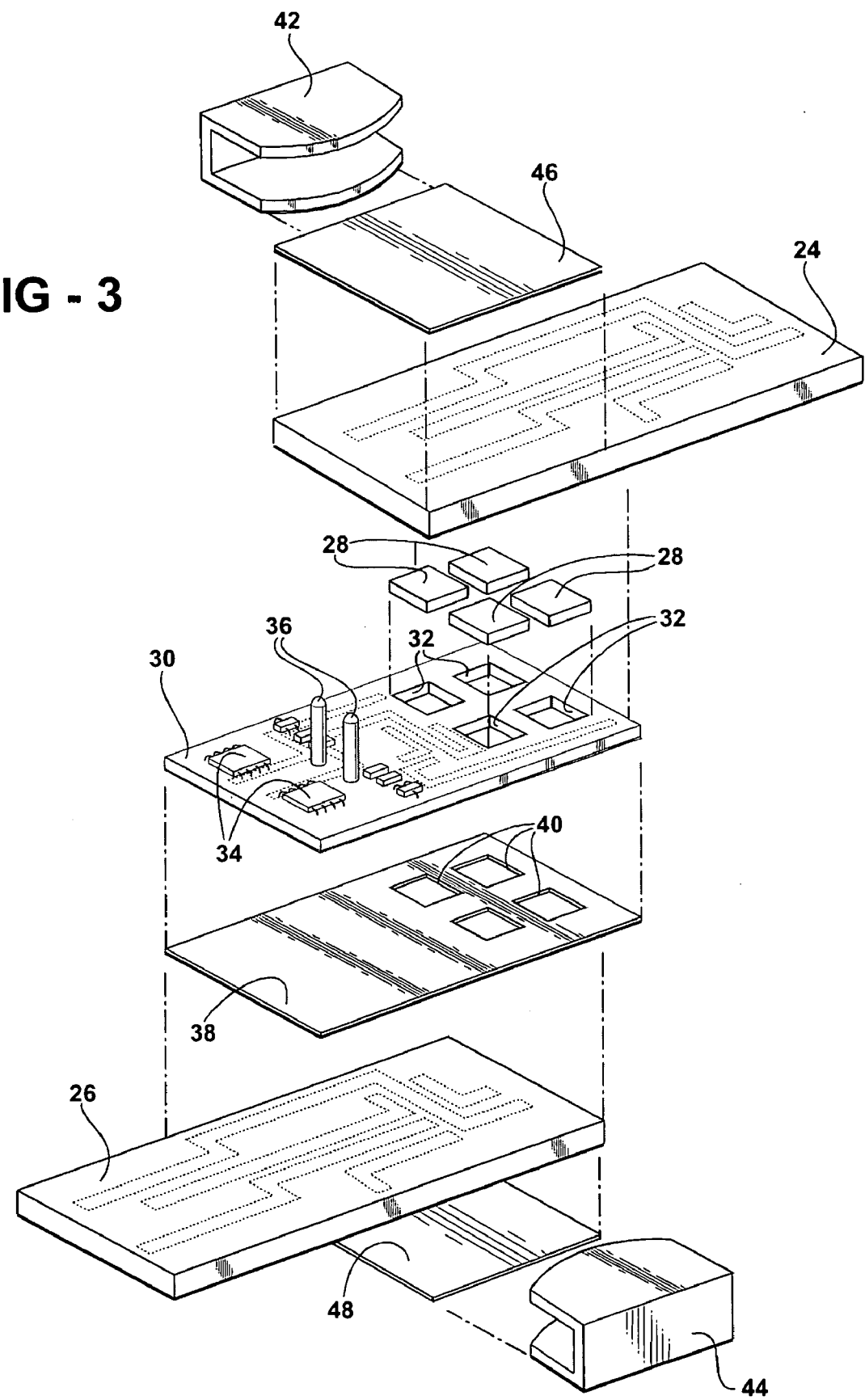
FIG. 3 is an exploded view of the device of FIG. 2.
Figure 4:
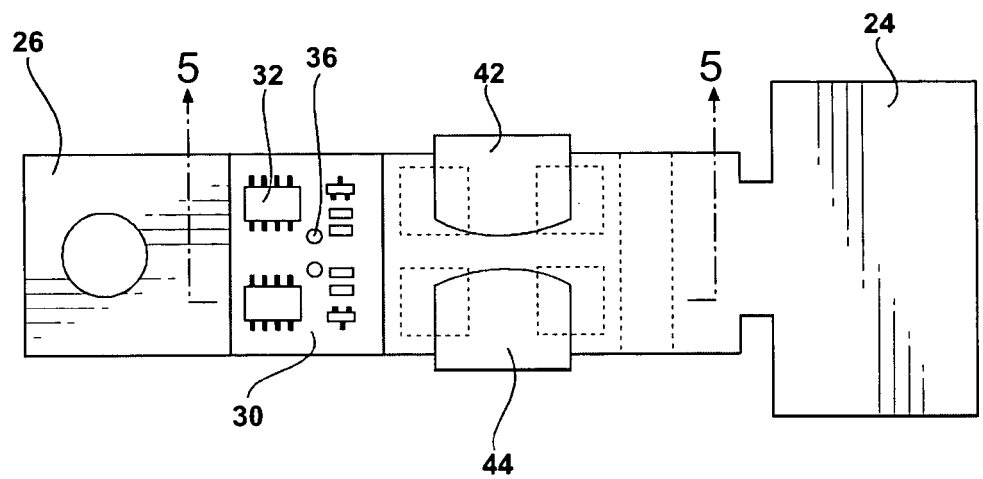
FIG. 4 is a top plan view of the device of FIG. 2.

Further in accordance with the invention, spring clamps 42 and 44 are applied to the stacked arrangement as shown in FIGS. 2, 4, and 5 to apply a compressive force to the solder bonds and dies to maintain a low electrical resistance through the stacked arrangement, thereby essentially nullifying the effects of thermal cycling which normally lead to increase through resistance. Electrical insulators 46 and 48 are provided between the clamps and conductors. To prevent the compressive force from directly affecting the circuit board 30, a dielectric layer of paper or similar soft forest material 38 is disposed between the underside of the printed circuit board and the top contact surface of the bottom conductor 26 as shown. The paper layer 38 is provided with holes 40 which register with the holes 32 in the printed circuit board and the semiconductor dies 28 to permit the solder pads 52 to extend there through.

It will be understood that the use of four parallel connected semiconductor dies 28 is illustrative rather than limiting. It will also be understood that the stacking concept may be extended into additional layers as required to meet specific circuit arrangements.

It will be further understood and appreciated that the arrangement shown eliminates the need for wire bonds, reduces inefficiency as a result of resistive losses and dramatically narrows the package relative to the prior art arrangement shown in FIG. 1.

While the invention has been described in connection with what is presently considered to be the most practical and preferred embodiment, it is to be understood that the invention is not to be limited to the disclosed embodiments but, on the contrary, is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. A power semiconductor device comprising:
  a printed circuit board (PCB) having first and second, opposite sides;
  a first semiconductor die including a gate, drain and source, the semiconductor die being positioned on a first side of the PCB with the gate being soldered to the PCB;
  a first conductor spaced from the first side of the PCB by the semiconductor die, the drain of the semiconductor die being soldered to the first conductor;
  a second conductor spaced from the second side of the PCB by an electrical insulator, the source of the semiconductor die being soldered to the second conductor through solder holes in the PCB and insulator;
  at least one spring applying a clamping force between the first and second conductors; and
  an electrically insulating layer of material between the spring and each conductor.

2. A device as defined in claim 1 further including a second semiconductor die having gate, drain and source, positioned mechanically and parallel with said first semiconductor die with the gate thereof also being soldered to the PCB, the drain being soldered to the first conductor and the source being soldered to the second conductor.

3. A power semiconductor circuit comprising:
  a bottom conductor having a contact surface;
  a top conductor in overlying spaced relation to the bottom conductor and having a contact surface facing the contact surface of the top conductor;
  at least one power semiconductor die having drain, source and gate electrodes, said die being disposed between the facing contact surfaces and having source and drain electrodes in electrically conductive contact relationship with respective contact surfaces;
  a circuit board disposed between the contact surfaces and carrying components connected electrically to the gate electrode of the at least one power semiconductor die; and
  a clamp for applying a compressive force to the top and bottom conductors and to the semiconductor die which is electrically conductively disposed therebetween.

4. A circuit as described in claim 3 wherein the source and drain electrodes are soldered to their respective contact surfaces.

5. A circuit as defined in claim 4 wherein the solder connection between one of the electrodes and the bottom contact surface passes through the circuit board.

6. A circuit as defined in claim 5 further including a compressable insulative layer disposed between the circuit board and the bottom conductor to isolate the circuit board from compressive force.

7. A circuit as defined in claim 3 wherein said clamp comprises multiple spring clamps attached to said device in a mechanically symmetrical relationship.

8. A circuit as defined in claim 3 wherein said at least one die comprises multiple dies disposed mechanically and electrically in parallel.

* * * * *